United States Patent
Ogawa et al.

(10) Patent No.: US 9,761,466 B2
(45) Date of Patent: Sep. 12, 2017

(54) APPARATUS AND METHOD FOR CLEANING SEMICONDUCTOR SUBSTRATE

(71) Applicant: Toshiba Memory Corporation, Minato-ku (JP)

(72) Inventors: Yoshihiro Ogawa, Yokkaichi (JP); Hajime Onoda, Kawasaki (JP); Hiroshi Kawamoto, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 136 days.

(21) Appl. No.: 14/271,679

(22) Filed: May 7, 2014

(65) Prior Publication Data

US 2014/0238452 A1 Aug. 28, 2014

Related U.S. Application Data

(62) Division of application No. 12/845,371, filed on Jul. 28, 2010, now Pat. No. 8,758,521.

(30) Foreign Application Priority Data

Sep. 24, 2009 (JP) ................................. 2009-219111

(51) Int. Cl.
*H01L 21/67* (2006.01)
*B08B 3/02* (2006.01)
(Continued)

(52) U.S. Cl.
CPC ........ *H01L 21/67028* (2013.01); *B08B 3/022* (2013.01); *C11D 11/0047* (2013.01); *H01L 21/02057* (2013.01)

(58) Field of Classification Search
CPC ........... C11D 11/0047; H01L 21/02057; H01L 21/02043; H01L 21/02052;
(Continued)

(56) References Cited

U.S. PATENT DOCUMENTS 5,472,516 A * 12/1995 Hanson ............. H01L 21/02052
134/18
5,975,097 A * 11/1999 Yonemizu ......... H01L 21/67051
134/147
(Continued)

FOREIGN PATENT DOCUMENTS

JP   2003-51481    2/2003
JP   2003-283103   10/2003
(Continued)

OTHER PUBLICATIONS

Notification of Reasons for Refusal issued on Oct. 25, 2011, in the Corresponding Japanese Patent Application No. 2009-219111 (w/English translation).

(Continued)

*Primary Examiner* — David Cormier
(74) *Attorney, Agent, or Firm* — Oblon, McClelland, Maier & Neustadt, L.L.P.

(57) ABSTRACT

A cleaning apparatus for a semiconductor substrate includes a belt conveyor, a treatment head that executes cleaning, rinsing and drying treatments, a rinse water supplying mechanism that supplies rinse water adjusted to a predetermined pH value to the treatment head and configured to rinse the substrate applies heat to the rinse water to set a rinse water temperature to 70° or above, and an optical mechanism. The treatment head is configured to rinse the substrate. The optical mechanism is configured to recognize a pattern on the semiconductor substrate so that the semiconductor substrate can be automatically placed on the belt conveyor with a direction of the recognized pattern and a feeding direction of the belt conveyor having a predetermined relationship. The treatment head includes a drying treatment mechanism configured to execute both a drying treatment
(Continued)

with use of drying solvent and lamp annealing in execution of drying treatment.

2 Claims, 9 Drawing Sheets

(51) Int. Cl.
  *C11D 11/00* (2006.01)
  *H01L 21/02* (2006.01)
(58) Field of Classification Search
  CPC ........... H01L 21/02054; H01L 21/0209; H01L 21/67017; H01L 21/67023; H01L 21/67028; H01L 21/6704; H01L 21/67051; B08B 3/022; B08B 3/123
  See application file for complete search history.

(56) References Cited

U.S. PATENT DOCUMENTS

| | | | |
|---|---|---|---|
| 6,001,191 A | 12/1999 | Kamikawa et al. | |
| 6,230,720 B1 | 5/2001 | Yalamanchili et al. | |
| 6,354,309 B1 | 3/2002 | Arndt et al. | |
| 7,012,051 B2 | 3/2006 | Daviot et al. | |
| 7,368,226 B2 | 5/2008 | Bae | |
| 7,632,376 B1* | 12/2009 | Ravkin | B82Y 40/00 156/345.1 |
| 2001/0027797 A1* | 10/2001 | Yoshioka | B08B 1/02 134/1 |
| 2002/0062841 A1 | 5/2002 | Twu et al. | |
| 2002/0121286 A1 | 9/2002 | Verhaverbeke et al. | |
| 2003/0032292 A1 | 2/2003 | Noguchi | |
| 2004/0163683 A1 | 8/2004 | Sugimoto et al. | |
| 2008/0078427 A1 | 4/2008 | Matsunaga | |
| 2011/0230054 A1 | 9/2011 | Tomita et al. | |

FOREIGN PATENT DOCUMENTS

| | | |
|---|---|---|
| JP | 2004-78217 | 3/2004 |
| JP | 2006-11048 | 1/2006 |
| JP | 2006-73945 | 3/2006 |
| JP | 2007-73806 | 3/2007 |
| JP | 2007-281438 | 10/2007 |
| JP | 2009-10256 | 1/2009 |
| JP | 2009-16800 | 1/2009 |
| WO | WO 01/42727 | 6/2001 |

OTHER PUBLICATIONS

Japanese Notification of Reasons for Refusal issued Mar. 21, 2012 in Japan Patent Application No. 2009-219111 (w/English translation).

* cited by examiner

APPARATUS AND METHOD FOR CLEANING SEMICONDUCTOR SUBSTRATE

CROSS-REFERENCE TO RELATED APPLICATIONS

This application is a division of and claims the benefit of priority under 35 U.S.C. §120 from U.S. Ser. No. 12/845,371 filed Jul. 28, 2010, and claims the benefit of priority under 35 U.S.C. §119 from Japanese Patent Application No. 2009-219111 filed Sep. 24, 2009, the entire contents of each of which are incorporated herein by reference.

BACKGROUND

1. Field

The present invention relates to an apparatus and method for cleaning a semiconductor substrate such as wafers.

2. Related Art

In a step of cleaning a semiconductor substrate, water rinse is executed after a chemical treatment and thereafter, spin drying or isopropyl alcohol (IPA) drying is executed. In the spin drying, rinse water is thrown off by a centrifugal force and thereafter, water drops left on a surface of the semiconductor substrate are evaporated. The spin drying results in a problem that fine patterns formed on the semiconductor substrate are collapsed by a capillary force due to a surface tension of water left on a surface of the semiconductor substrate. The problem has become more evident with recent progress in structural refinement of semiconductor devices.

The foregoing problem can be overcome by employment of the IPA drying instead of the spin drying to some extent since IPA has a smaller surface tension that is substantially one third of the surface tension of water. For example, U.S. Pat. No. 6,001,191 discloses a drying apparatus which can improve throughput in the IPA drying. However, with further progress in the structural refinement, adverse influences the drying step has on refined patterns have been desired to be reduced in refined devices after 30-nanometer generation.

SUMMARY

According to one embodiment of the present invention, a cleaning apparatus for a semiconductor substrate includes a belt conveyor, a treatment head, a rinse water supplying mechanism, and an optical mechanism configured to recognize a pattern on the semiconductor substrate. The belt conveyor feeds the semiconductor substrate. The treatment head define a cleaning space through which the semiconductor substrate is fed by the belt conveyor. The treatment head executes a cleaning treatment, a rinsing treatment and a drying treatment for the semiconductor substrate passed through the cleaning space. The rinse water supplying mechanism supplies rinse water adjusted to a predetermined pH value indicative of acidity to the treatment head and applies heat to the rinse water thereby to set a temperature of the rinse water to 70° or above. The treatment head is configured to rinse the semiconductor substrate for a first treating time set to not more than 10 seconds. By virtue of the pattern recognized by the optical mechanism, the semiconductor substrate can automatically be placed on the belt conveyor with a direction of the pattern recognized by the optical mechanism and a feeding direction of the belt conveyor having a predetermined relationship. In the rinsing treatment, the treatment head is configured to rinse the semiconductor substrate for a first treating time set to not more than 10 seconds. In the drying treatment, the treatment head is configured to dry the semiconductor substrate for a second treating time set to not more than 10 seconds and to depressurize a part of the semiconductor substrate, which part is under the drying treatment. The rinse water supplying mechanism includes a deionized water supplying section, a hydrochloric acid supplying section, a rinse water mixing section which stores and mixes the deionized water delivered from the deionized water supplying section and the hydrochloric acid delivered from the hydrochloric acid supplying section, and a control section which controls the deionized water supplying section and the hydrochloric acid supplying section. The rinse water mixing section includes a pH sensor which detects a pH value of the rinse water stored in the rinse water mixing section, a temperature sensor which detects a temperature of the rinse water stored in the rinse water mixing section, and a heater which applies heat to the rinse water stored in the rinse water mixing section. The control section is configured to receive detection signals from the pH sensor and the temperature sensor and to control the heater. The treatment head includes an upper head and a lower head and is configured to insert the semiconductor substrate into the cleaning space located between the upper and lower heads of the treatment head and to cause the semiconductor substrate to pass through the cleaning space while being fed by the belt conveyor. The treatment head includes a chemical treatment section, a rinse treatment section and a drying treatment section. All the sections are disposed sequentially from a side of the semiconductor substrate that is firstly inserted into the cleaning space. The chemical treatment section is configured to discharge a cleaning chemical onto a surface of the semiconductor substrate thereby to chemically clean the semiconductor substrate and to retrieve the used chemical. The rinse treatment section is configured to discharge the rinse water onto a surface of the semiconductor substrate thereby to rinse the semiconductor substrate and to retrieve the used rinse water. The drying treatment section has a drying treatment mechanism executing both a drying treatment with use of a drying solvent and lamp annealing in execution of a drying treatment. The drying treatment section is configured to form a pressure-reduced space above a region of the semiconductor substrate corresponding to the drying treatment section. The semiconductor substrate is aligned on the belt conveyor so that a line-and-space pattern formed thereon extends in a direction substantially parallel to a direction in which the semiconductor substrate is fed.

DETAILED DESCRIPTION

Figure 1:
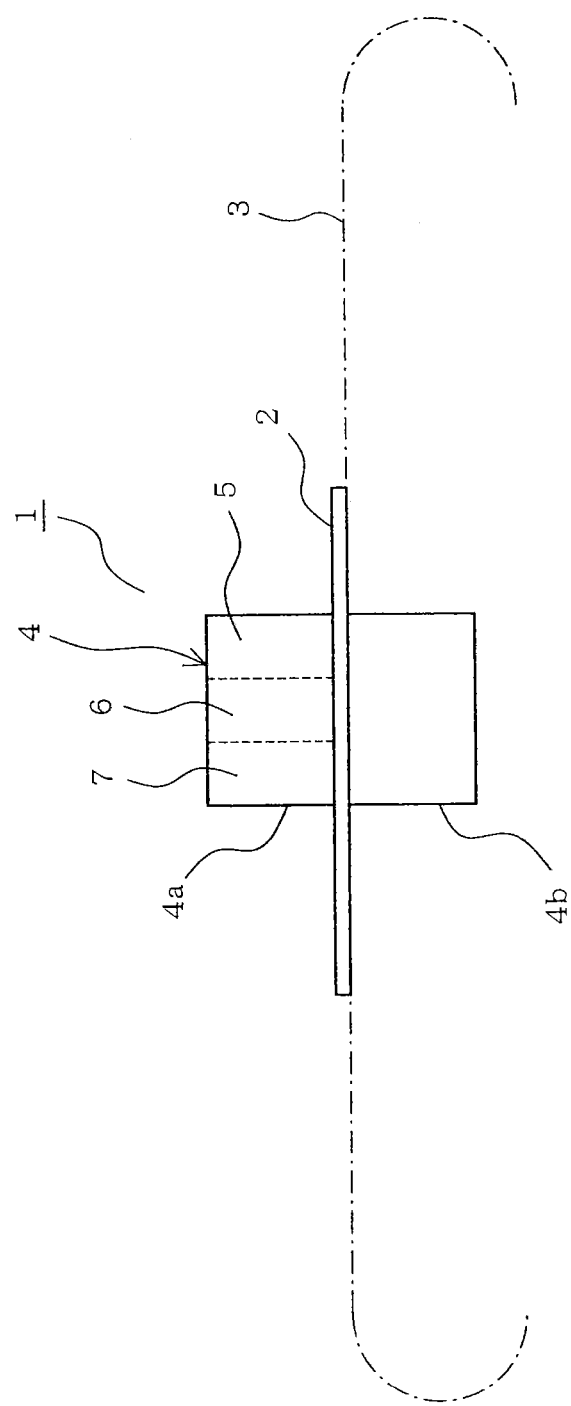
FIG. 1 is a side view of a semiconductor substrate cleaning apparatus in accordance with a first embodiment.
Figure 2:
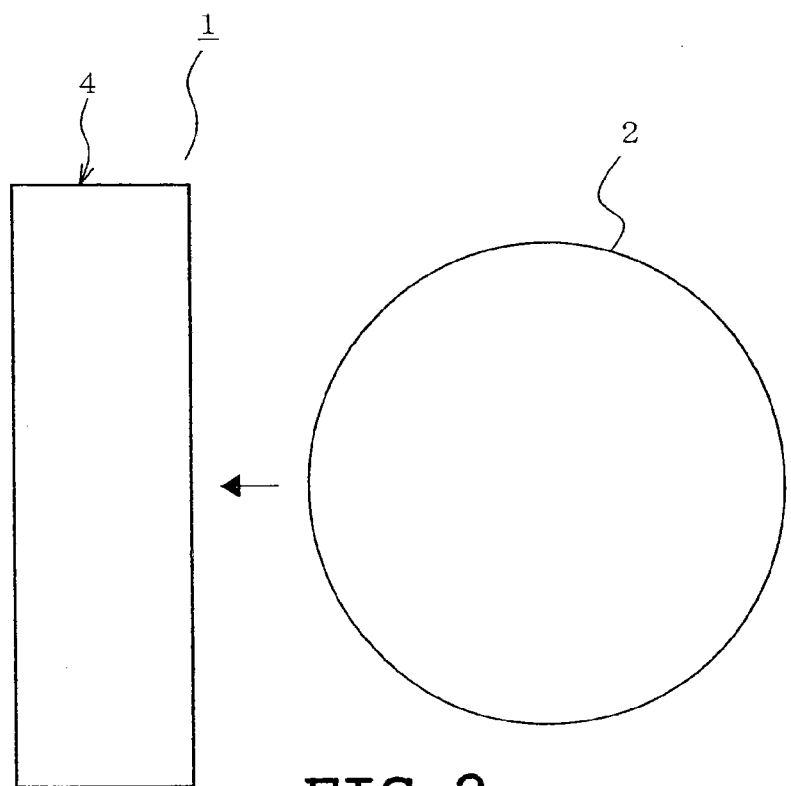
FIG. 2 is a top plan view of the cleaning apparatus.
Figure 3:
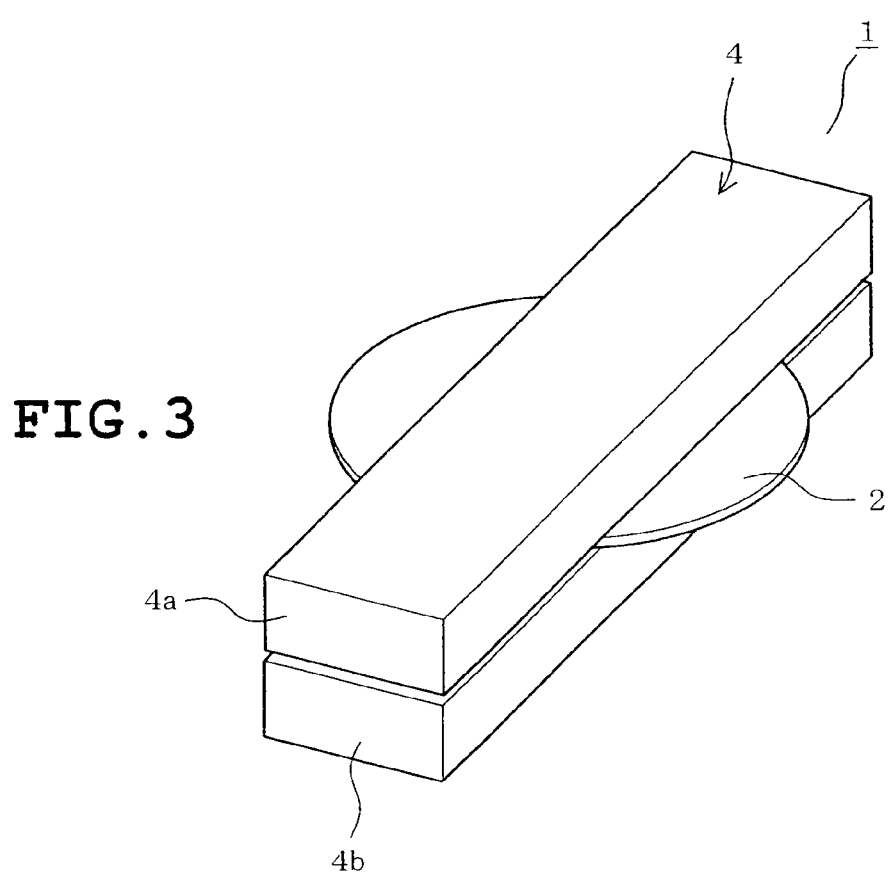
FIG. 3 is a perspective view of the cleaning apparatus.

A first embodiment will be described with reference to FIGS. 1 to 8. Identical or similar parts are labeled by the same reference symbols throughout the description. A cleaning apparatus 1 is constructed into a belt-conveyor feed type cleaning apparatus as shown in FIGS. 1 to 3. The cleaning apparatus 1 comprises a belt conveyor 3 which feeds a wafer (semiconductor substrate) 2 placed thereon and a cleaning treatment head 4 which cleans the wafer 2. The cleaning treatment head 4 includes an upper head 4a and a lower head 4b. In this construction, the wafer 2 is conveyed on the belt conveyor 3 and is passed through a cleaning treatment space defined between the upper and lower heads 4a and 4b.

The cleaning treatment head 4 (that is, the upper and lower heads 4a and 4b) is provided with a chemical treatment section 5, a rinse treatment section 6 and a drying treatment section 7 all of which are arranged sequentially from the wafer 2 insertion side (the right end side as viewed in FIG. 1). The chemical treatment section 5 has a function of discharging a cleaning chemical onto a surface of the wafer 2 to chemically clean the wafer 2 and a function of retrieving the used chemical. The rinse treatment section 6 has a function of discharging rinse water (warm acidic water as will be described later) onto the surface of the wafer 2 to rinse the wafer 2 with the rinse water and a function of retrieving the used rinse water.

The drying treatment section 7 has a function of spraying drying IPA and drying $N_2$ gas onto the surface of the wafer 2. The drying treatment section 7 also has a function of reducing the pressure in a space above a region of the wafer 2 surface corresponding to the drying treatment section 7. In this regard, a pressure-reducing sealing section (not shown) is disposed so as to surround the aforesaid region of the wafer surface and so as to define a slight gap between the wafer surface and the same. The aforesaid space above the region of the wafer 2 is evacuated by a vacuum pump such as a rotary pump, whereby a predetermined pressure-reduced space can be defined. The wafer 2 can be conveyed on the belt conveyor 3 in the drying treatment section 7 even while in the aforementioned pressure-reduced state.

Figure 4:
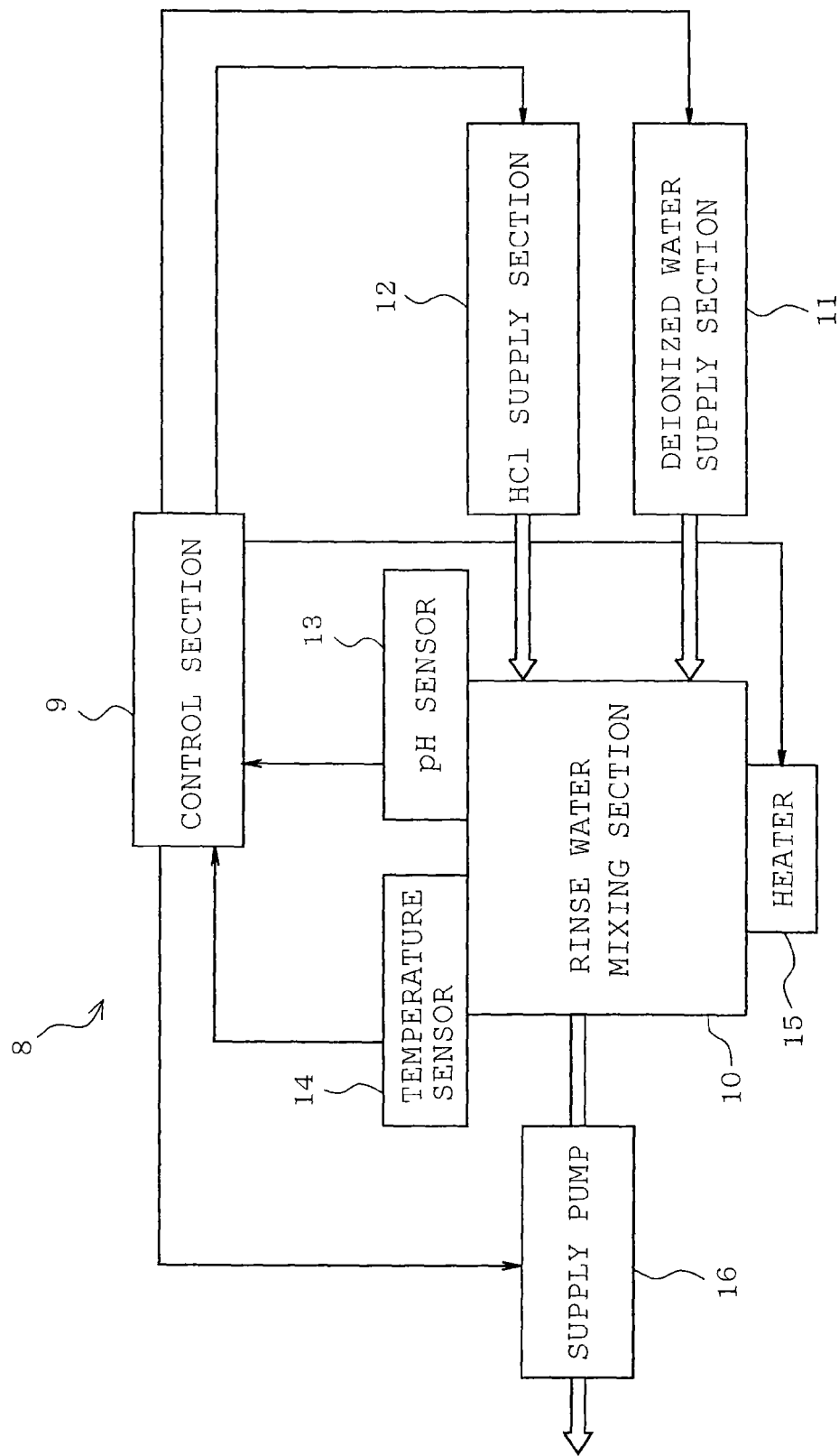
FIG. 4 is a schematic block diagram of a rinse water supplying mechanism of the cleaning apparatus.
Figure 5:
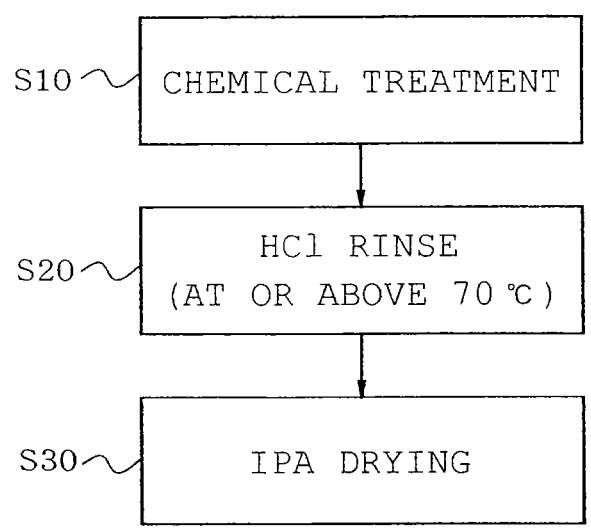
FIG. 5 is a flowchart showing the cleaning treatment.

A rinse water supply mechanism 8 supplying rinse water (warm acidic water) into the rinse treatment section 6 will be described with reference to FIG. 4. The rinse water supply mechanism 8 includes a control section 9, a rinse water mixing section 10, a deionized water supply section 11 and a hydrochloric acid (HCl) supply section 12. The deionized water supply section 11 comprises a tank storing deionized water and a pump which pumps the deionized water from the tank, although neither is shown. The HCl supply section 12 comprises a tank storing HCl and a pump which pumps the HCl from the tank, although neither is shown.

The rinse water mixing section 10 stores the deionized water delivered from the deionized water supply section 11 and the HCl delivered from the HCl supply section 12, mixing the deionized water and the HCl. The rinse water mixing section 10 is provided with a pH sensor 13 detecting a pH value of the rinse water therein, a temperature sensor 14 detecting a temperature of the rinse water therein and a heater 15 which applies heat to the rinse water therein. The control section 9 to which detection signals are delivered from the pH sensor 13 and the temperature sensor 14 controls the pump of the deionized water supply section 11, the pump of the HCl supply section 12 and the heater 15. In this case, the rinse water has the pH around 7 without supply of HCl, and the pH is gradually rendered smaller than 7 when an amount of HCl to be supplied is increased. Furthermore, the temperature of the rinse water rises upon energization of the heater 15 and drops upon de-energization. As a result, the control section 9 controls the pumps of the respective sections 11 and 12 and the heater 15 so that rinse water having a desired pH value and a desired temperature is produced and stored in the rinse water mixing section 10. The control section 9 further controls a supply pump 16 so that the produced rinse water is supplied into the rinse treatment section 6.

The following describes the treatment of cleaning the wafer 2 formed with a line-and-space pattern by the use of the above-described cleaning apparatus 1, with reference to FIGS. 5 to 8. Firstly, the chemical treatment of chemically cleaning the wafer 2 (the treatment by the chemical treatment section 5) is executed by the use of a general cleaning liquid such as ammonia hydroxide-hydrogen peroxide-water mixture (APM), sulfuric-hydrogen peroxide-water mixture (SPM) or the like, as shown as step S10 in FIG. 5. Subsequently, when the wafer 2 is to be rinsed by the rinse treatment section 6, the temperature of the rinse water is set to the value of 70° C. or above and the pH value of the rinse water is set so as to be less than 7, as shown as step S20 in FIG. 5. More specifically, the rinse water which has become acidic as the result of dissolution of HCl is used.

Figure 6:
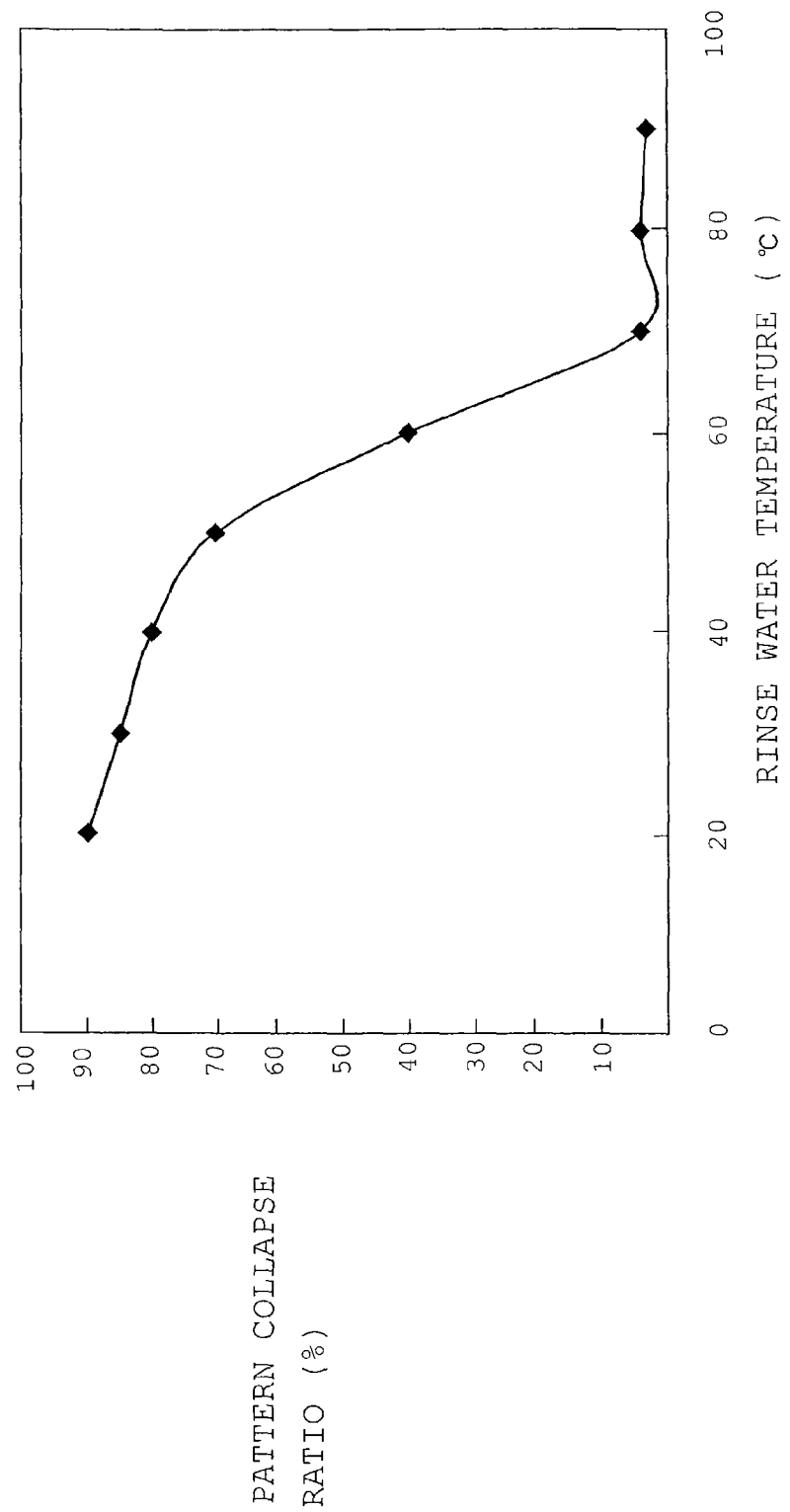
FIG. 6 is a graph showing the relationship between a rinse water temperature and a pattern collapse ratio.
Figure 7:
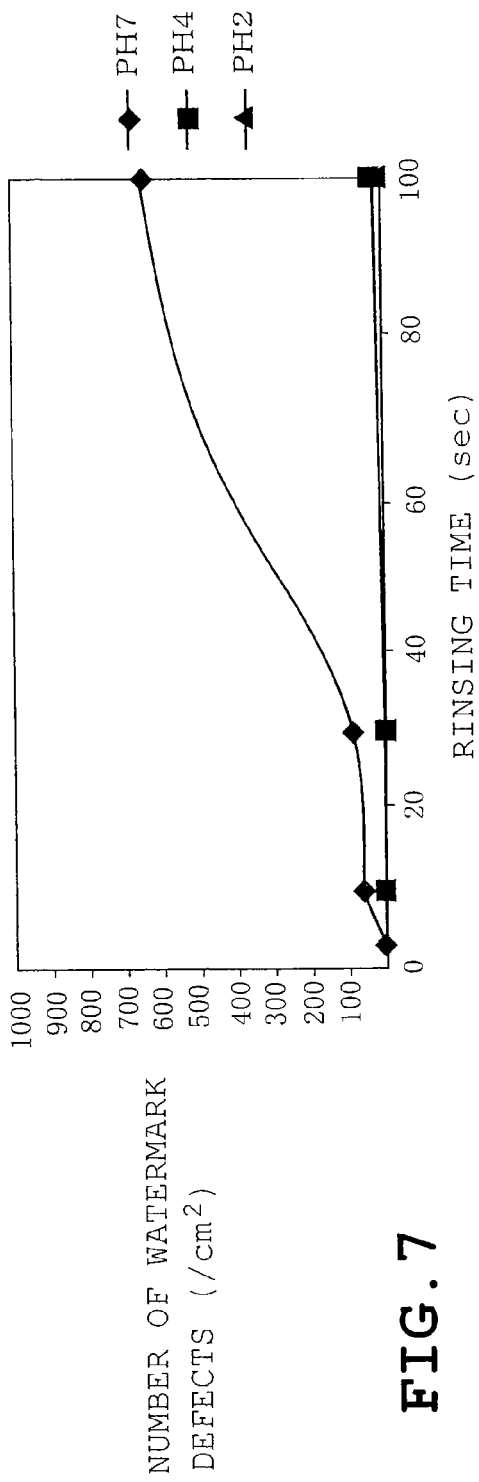
FIG. 7 is a graph showing the relationship among a pH value of rinse water, a rinsing time and the defect density.

The following describes the reason for the setting of the rinse water temperature to 70° C. or above. When the temperature of the rinse water is less than 70° C., adjacent line patterns collapse to adhere to each other, thereby closing a space pattern between the adhered line patterns. The adhesion between the adjacent line patterns results in a defect of closing line-and-space patterns as shown in FIG. 6. FIG. 6 is a graph showing the result of an experiment conducted by the inventors. According to the graph of FIG. 6, the pattern collapse ratio can be rendered sufficiently small when the temperature of rinse water is set to 70° C. or above. However, since a dissolution rate of silicon is increased when the temperature of rinse water rises, another problem occurs that a watermark defect tends to be produced more easily. In the embodiment, however, the rinsing time is set to 10 seconds or below and the acidic rinse water (rinse water with pH below 7) is used, whereby silicon is prevented from being dissolved into the rinse water. This can suppress an occurrence of watermark defect. FIG. 7 shows the relationship among the pH value of rinse water, a rinsing time and the number of watermark defects (per $cm^2$). FIG. 7 also shows the result of an experiment conducted by the inventors. As understood from FIG. 7, an occurrence of watermark defect can sufficiently be suppressed when the rinse water is rendered acidic (when the pH value of rinse water is set to 4 or 2).

Figure 8:
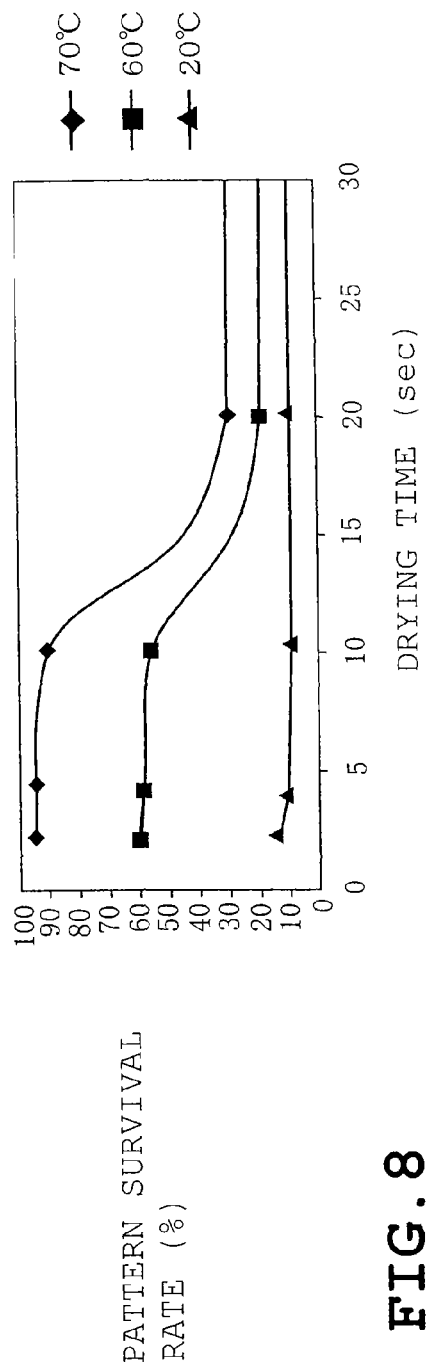
FIG. 8 is a graph showing the relationship among a rinse water temperature, a drying time and a pattern survival rate.

FIG. 8 is a graph showing the relationship among the temperature of rinse water, a drying time and a survival rate of line-and-space pattern. The graph of FIG. 8 shows that the pattern survival rate can be rendered sufficiently high and more specifically, a closure ratio of a closed space pattern to an open space pattern can be rendered sufficiently low when the temperature of rinse water is set to 70° C. or above and the drying time is rendered short (not more than 10 seconds, for example).

The following describes a force acting on a line-and-space pattern when a closure ratio is increased. This force increasing the closure ratio generally results from a capillary force F. When symbol γ designates a surface expansion of liquid, symbol θ designates a contact angle and symbol ΔH designates a difference between right and left liquid levels of the pattern, the capillary force F is proportional to γ, cos θ and ΔH. Accordingly, when a drying speed is increased, a period of time for which the capillary force F is large is shortened so that an amount of deformation of the line-and-space pattern is rendered smaller, whereby the closure ratio would be reduced.

After having been rinsed by the rinse treatment section 6, the wafer 2 is subsequently dried by the drying treatment section 7 (the IPA drying treatment), whereby the cleaning of the wafer 2 is completed. The temperatures of the IPA gas and $N_2$ gas are set so as to be higher than the temperature of the wafer 2.

Figure 9:
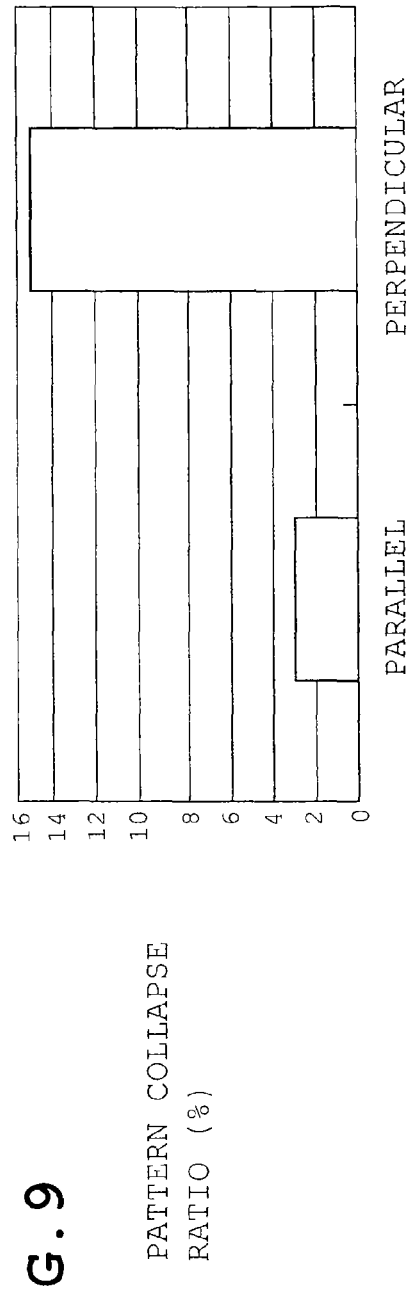
FIG. 9 is a graph showing the relationship among a pattern collapse ratio, a case where the direction in which the line-and-space pattern extends is parallel to a direction in which the semiconductor substrate is fed, and a case where both directions are perpendicular to each other, showing a second embodiment.
Figure 10:
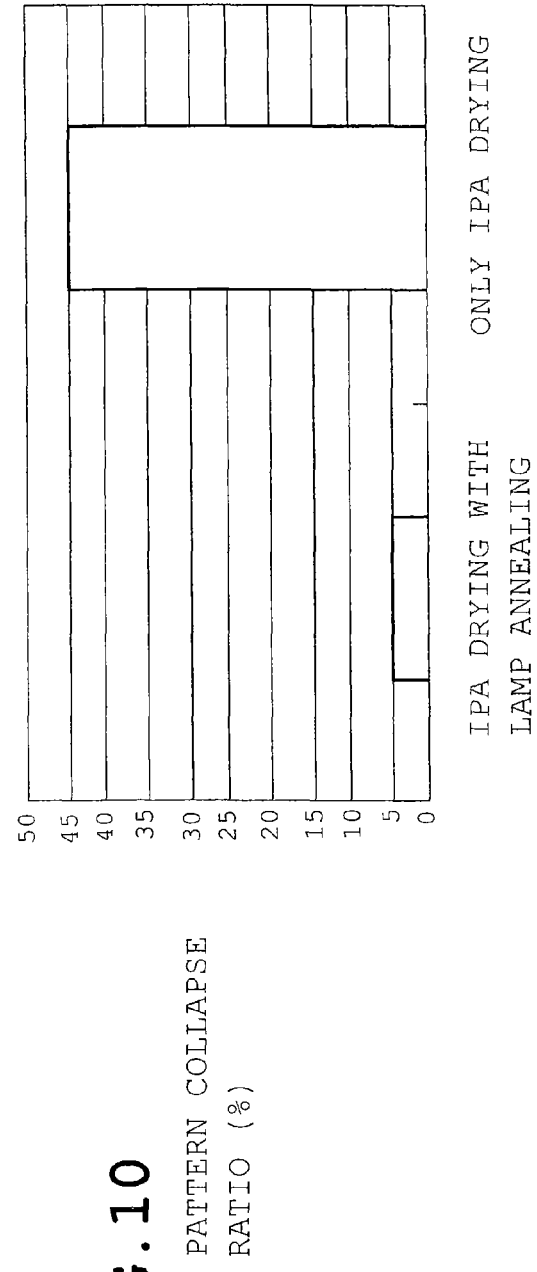
FIG. 10 is a graph showing the relationship between execution and non-execution of lamp annealing in IPA drying and a pattern collapse ratio.

FIGS. 9 and 10 illustrate a second embodiment. The above-described belt-conveyor-type cleaning apparatus 1 is also used in the second embodiment. The feeding speed of the wafer 2 is set so that a treating time of each of the chemical, rinse and drying treatment sections 5, 6 and 7 is not more than 5 seconds. Furthermore, before cleaned by the chemical treatment section 5 or inserted into the chemical treatment section 5, the wafer 2 is aligned based on the position of a notch (not shown) formed therein so that a direction in which the line-and-space pattern formed on the wafer 2 extends is substantially parallel to a direction in which the wafer 2 is fed (a feeding direction of the belt conveyor 3). The wafer 2 thus aligned is placed on the belt conveyor 3. The belt conveyor 3 is provided with an optical mechanism (not shown) having a function of recognizing patterns on the wafer 2, for example. The cleaning apparatus 1 is arranged and constructed so as to change a notch-aligning direction of the wafer 2 in a range of 0 to 90° in response to a signal delivered from the optical mechanism, whereupon the wafer 2 can automatically be placed on the belt conveyor 3.

Thereafter, the wafer 2 is fed by the belt conveyor 3 to be inserted into the chemical treatment section 5. The chemical treatment in which the wafer 2 is chemically cleaned is executed in the same manner as in the first embodiment. A chemical treatment time is set to 5 seconds or below, for example. The wafer 2 is subsequently rinsed by the rinse treatment section 6 in the same manner as in the first embodiment. In this case, a temperature of the rinse water is set to 70° C. or above and the pH value of the rinse water is set so as to be below "7." A time period of the rinse treatment executed by the rinse treatment section 6 is set so as to be not more than 5 seconds, for example.

The drying treatment (the IPA drying treatment) is subsequently executed by the drying treatment section 7 substantially in the same manner as in the first embodiment. In executing the IPA drying treatment, the IPA drying section is provided with a function of lamp annealing. The wafer 2 is annealed with lamp heaters (not shown) in the IPA drying in the second embodiment so that water and the IPA are evaporated at a high speed for the purpose of rapidly drying the wafer 2. FIG. 10 shows the relationship between execution and non-execution of the lamp annealing in the IPA evaporation and the pattern collapse ratio of the line-and-space pattern. The graph of FIG. 10 is the result of an experiment conducted by means of a beaker test by the inventors. It can be understood from FIG. 10 that when the lamp annealing is executed in the IPA drying, the temperature of the wafer 2 is increased in a short period of time, with the result that water or IPA can be evaporated thereby to be dried particularly at a high speed. Furthermore, it can also be understood that the pattern collapse ratio of the line-and-space pattern is sufficiently reduced, with the result that the installation of the annealing lamp in the second embodiment is exceedingly effective. In this case, the annealing lamp may be installed at the surface side (a device surface) or the reverse side of the wafer 2. A treating time of the above-described IPA drying executed by the drying treatment section 7 is set to 5 seconds or below, for example.

FIG. 9 shows the relationship among the case where the direction in which the line-and-space pattern formed on the wafer 2 extends is parallel to (that is, corresponds with) the direction in which the wafer 2 is fed by the belt conveyor 3, the case where the extending direction of the line-and-space pattern is not parallel to (that is, is perpendicular to) the wafer 2 feeding direction, and the pattern collapse ratio of line-and-space pattern. The graph of FIG. 9 is also the result of an experiment conducted by the inventors. As understood from FIG. 9, the pattern collapse ratio of the line-and-space pattern can sufficiently be reduced when the extending direction of the line-and-space pattern is parallel to the wafer 2 feeding direction.

Although the IPA is used as the drying medium (a liquid, gas or the like) in the drying treatment in the second embodiment, a hydrofluoroether (HFE), a mixture obtained by mixing not more than 5 volume percent of IPA with HFE, or the like, may be used instead of IPA. A higher safety can be achieved in the lamp annealing when the aforementioned mixture is used.

Figure 11:
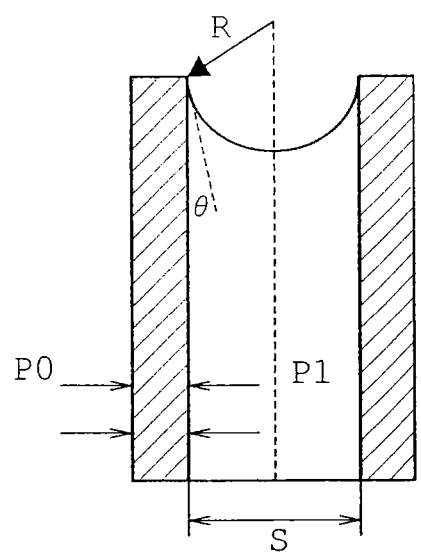
FIG. 11 is a graph showing a capillary force in a third embodiment.

FIG. 11 illustrates a third embodiment. The foregoing belt-conveyor-type cleaning apparatus 1 is also used in the third embodiment. In the third embodiment, when the IPA drying treatment is executed for the wafer 2 by the drying treatment section 7, the vacuum pump of the drying treatment section 7 is operated so that the pressure is reduced in a space above a region of the wafer 2 surface corresponding to the drying treatment section 7. This manner of decompression reduces a line-and-space pattern collapsing force, thereby further lowering the pattern closure ratio.

The following describes the property that the line-and-space pattern collapsing force is reduced upon decompression of the aforesaid space, with reference to FIG. 11, which shows a capillary action. Since a capillary force ΔP results from the pressure difference, the capillary force ΔP is shown by the following equation:

$$\Delta P = P0 - P1$$

where P0 is a pressure applied to an outer surface of a sidewall and P1 is a pressure applied to an inner surface (rinse water side) of the sidewall. Furthermore, the following two equations hold:

$$\Delta P = \gamma / R$$

$$1/R = 2(\cos \theta)/S$$

where γ is a surface tension of rinse water, R is a curvature radius of the rinse water surface, θ is a contact angle of rinse water relative to the sidewall and S is a distance between wall surfaces. From the above-mentioned two equations, the following equation holds:

$$\Delta P = 2\gamma(\cos \theta)/S$$

As understood from the foregoing equations, when P0 is small (that is, the space is decompressed), R is increased, cosine θ is reduced and the capillary force ΔP (that is, the pattern collapsing force) is reduced. Accordingly, when the pressure is reduced in the space above the region of the wafer 2 corresponding to the drying treatment section 7, the pattern collapsing force can be reduced such that the pattern collapse ratio can further be reduced.

Figure 12:
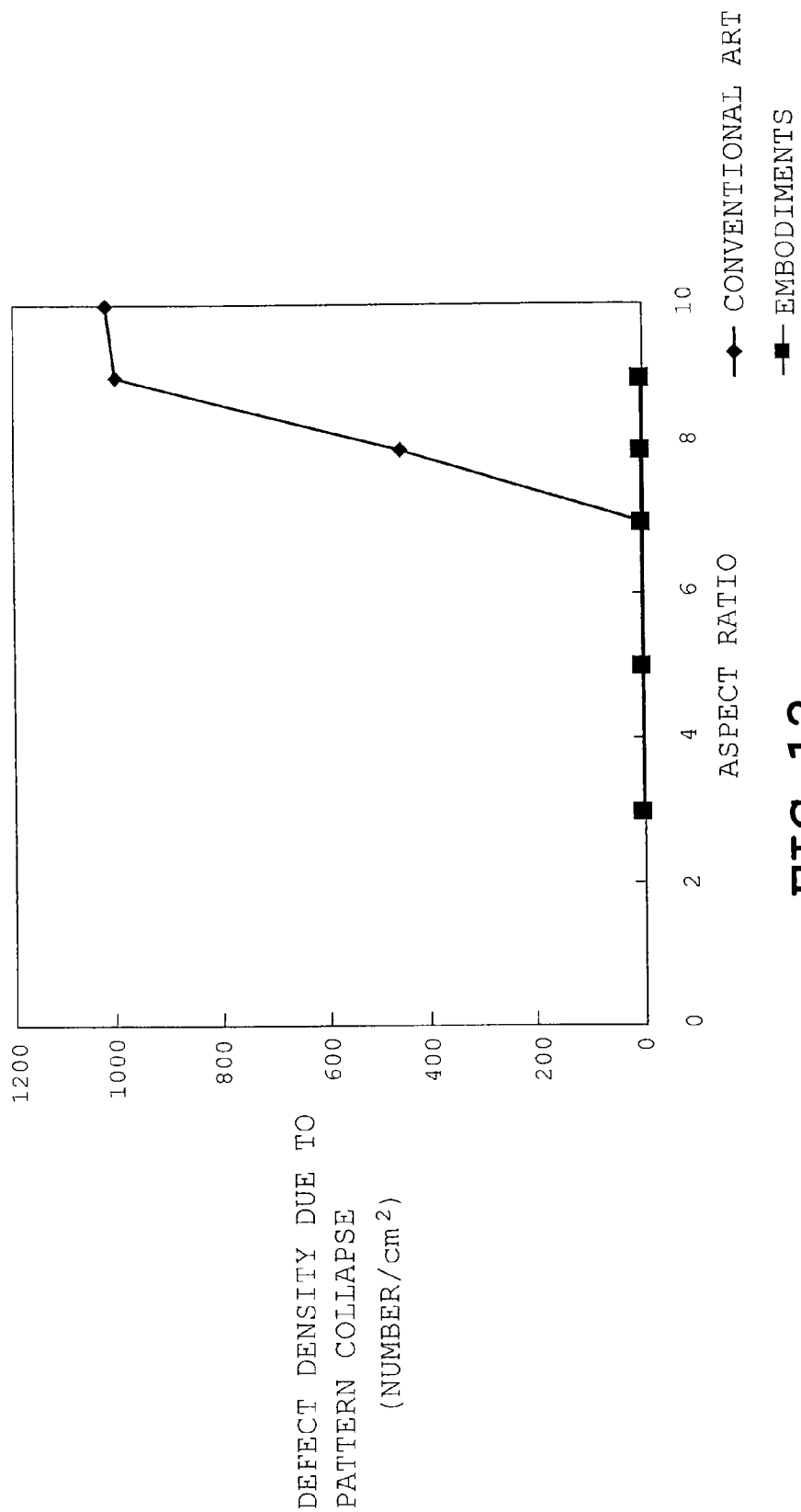
FIG. 12 is a graph showing the relationship between a defect density due to increase in pattern collapse and an aspect ratio of line-and-space pattern with respect to a conventional configuration and the configurations of the first to third embodiments.

FIG. 12 shows the results of measurement of defect densities due to collapse of line patterns resulting from an increase in the pattern collapse in the case where an aspect ratio of the line-and-space pattern is varied as a variable, regarding a conventional art and the above-described first to third embodiments. As understood from FIG. 12, sufficiently good results can be achieved even in the drying treatment of the patterns with high aspect ratios which are at or above 8 and tend to result in an increase in the pattern collapse as one of pattern defects, according to the first to third embodiments. In particular, the cleaning method of each above-described embodiment can achieve a remarkable effect when a semiconductor substrate formed with a fine line-and-space pattern which has a half pitch of not more than 30 nm and is formed by a sidewall transformation method as one of double patterning processes.

The foregoing embodiments should not be restrictive but can be modified or expanded as follows. The belt-conveyor feed type cleaning apparatus 1 is used in each foregoing embodiment. However, a single wafer type cleaning apparatus which spins the wafer 2 may be used when a brief treatment is allowed. Furthermore, a batch type cleaning-drying apparatus may be used instead of the belt-conveyor feed type cleaning apparatus 1. Furthermore, although the belt-conveyor type cleaning apparatus 1 is provided with the single cleaning treatment head 4 for the three treatment sections 5 to 7 in each foregoing embodiment, the belt-conveyor type cleaning apparatus may include three individual treatment heads for the respective treatment sections instead.

Although hydrochloric acid (HCl) is used to acidify the rinse water in each foregoing embodiment, a $CO_2$ gas may be dissolved in the rinse water instead.

The foregoing description and drawings are merely illustrative of the principles and are not to be construed in a limiting sense. Various changes and modifications will become apparent to those of ordinary skill in the art. All such changes and modifications are seen to fall within the scope as defined by the appended claims.

What is claimed is:

1. A cleaning apparatus for a semiconductor substrate, comprising:
   a belt conveyor which feeds a semiconductor substrate;
   a treatment head which defines a cleaning space through which the semiconductor substrate is fed by the belt conveyor, the treatment head executing a cleaning treatment, a rinsing treatment and a drying treatment for the semiconductor substrate passed through the cleaning space;
   a rinse water supplying mechanism which supplies rinse water adjusted to a predetermined pH value indicative of acidity to the treatment head and applies heat to the rinse water thereby to set a temperature of the rinse water to 70° C. or above; and
   an optical mechanism configured to recognize a pattern on the semiconductor substrate so that the semiconductor substrate can be automatically placed on the belt conveyor with a direction of the pattern recognized by the optical mechanism and a feeding direction of the belt conveyor having a predetermined relationship,
   wherein in the rinsing treatment, the treatment head is configured to rinse the semiconductor substrate for a first treating time set to not more than 10 seconds and in the drying treatment, the treatment head is configured to dry the semiconductor substrate for a second treating time set to not more than 10 seconds and to depressurize a part of the semiconductor substrate, which part is under the drying treatment,
   wherein the rinse water supplying mechanism includes a deionized water supplying section, a hydrochloric acid supplying section, a rinse water mixing section which stores and mixes the deionized water delivered from the deionized water supplying section and the hydrochloric acid delivered from the hydrochloric acid supplying section, and a control section which controls the deionized water supplying section and the hydrochloric acid supplying section;
   wherein the rinse water mixing section includes a pH sensor which detects a pH value of the rinse water stored in the rinse water mixing section, a temperature sensor which detects a temperature of the rinse water stored in the rinse water mixing section, and a heater which applies heat to the rinse water stored in the rinse water mixing section,
   wherein the control section is configured to receive detection signals from the pH sensor and the temperature sensor and to control the heater;
   wherein the treatment head includes an upper head and a lower head and is configured to insert the semiconductor substrate into the cleaning space located between the upper and lower heads of the treatment head and to cause the semiconductor substrate to pass through the cleaning space while being fed by the belt conveyor;
   wherein the treatment head includes a chemical treatment section, a rinse treatment section and a drying treatment section, all the sections being disposed sequentially from a side of the semiconductor substrate that is firstly inserted into the cleaning space;
   wherein the chemical treatment section is configured to discharge a cleaning chemical onto a surface of the semiconductor substrate thereby to chemically clean the semiconductor substrate and retrieve the used chemical;
   wherein the rinse treatment section is configured to discharge the rinse water onto a surface of the semiconductor substrate thereby to rinse the semiconductor substrate and retrieve the used rinse water;
   wherein the drying treatment section includes a drying treatment mechanism configured to execute both a drying treatment with use of a drying solvent and lamp annealing in execution of a drying treatment, the drying treatment section being configured to form a pressure-reduced space above a region of the semiconductor substrate corresponding to the drying treatment section; and
   wherein the semiconductor substrate is aligned on the belt conveyor so that a line-and-space pattern formed thereon extends in a direction substantially parallel to a direction in which the semiconductor substrate is fed.

2. The apparatus according to claim 1, wherein the drying treatment section sprays drying IPA and $N_2$ on a surface of the semiconductor substrate.

* * * * *